(12) United States Patent
Shinohara

(10) Patent No.: US 9,764,992 B2
(45) Date of Patent: Sep. 19, 2017

(54) SILICON CARBIDE-TANTALUM CARBIDE COMPOSITE AND SUSCEPTOR

(71) Applicant: TOYO TANSO CO., LTD., Osaka (JP)

(72) Inventor: Masato Shinohara, Kanonji (JP)

(73) Assignee: TOYO TANSO CO., LTD., Osaka-shi (JP)

( * ) Notice: Subject to any disclaimer, the term of this patent is extended or adjusted under 35 U.S.C. 154(b) by 201 days.

(21) Appl. No.: 14/652,210

(22) PCT Filed: Jan. 28, 2014

(86) PCT No.: PCT/JP2014/051821
§ 371 (c)(1),
(2) Date: Jun. 15, 2015

(87) PCT Pub. No.: WO2014/123036
PCT Pub. Date: Aug. 14, 2014

(65) Prior Publication Data
US 2015/0321966 A1    Nov. 12, 2015

(30) Foreign Application Priority Data

Feb. 6, 2013  (JP) ................................. 2013-021166
Feb. 6, 2013  (JP) ................................. 2013-021167
Feb. 6, 2013  (JP) ................................. 2013-021168

(51) Int. Cl.
*C04B 41/89* (2006.01)
*C04B 35/52* (2006.01)
(Continued)

(52) U.S. Cl.
CPC ............ *C04B 41/89* (2013.01); *C04B 35/522* (2013.01); *C04B 41/009* (2013.01);
(Continued)

(58) Field of Classification Search
CPC ..... C04B 41/89; C04B 35/522; C04B 41/009; C04B 41/5059; C04B 41/5061;
(Continued)

(56) References Cited

U.S. PATENT DOCUMENTS

2008/0035632 A1  2/2008 Fujita et al.
2011/0017353 A1  1/2011 Thebault et al.
(Continued)

FOREIGN PATENT DOCUMENTS

CN    101001978 A    7/2007
CN    101445392 A    6/2009
(Continued)

OTHER PUBLICATIONS

Notification of Transmittal of Translation of the International Preliminary Report on Patentability (Form PCT/IB/338) of International Application No. PCT/JP2014/051821 mailed Aug. 6, 2015 with Form PCT/IPEA/409 (6 pages).
(Continued)

*Primary Examiner* — Catherine A Simone
(74) *Attorney, Agent, or Firm* — Westerman, Hattori, Daniels & Adrian, LLP

(57) ABSTRACT

Provided is a silicon carbide-tantalum carbide composite having excellent durability. A silicon carbide-tantalum carbide composite (1) includes: a body (10) whose surface layer is at least partly formed of a first silicon carbide layer (12); a tantalum carbide layer (20); and a second silicon carbide layer (13). The tantalum carbide layer (20) is disposed over the first silicon carbide layer (12). The second silicon carbide layer (13) is interposed between the tantalum carbide layer (20) and the first silicon carbide layer (12). The second silicon carbide layer (13) has a C/Si composition ratio of not less than 1.2 as measured by X-ray photoelectron spectroscopy. The second silicon carbide layer (13) has a
(Continued)

peak intensity ratio G/D of not less than 1.0 between the G-band and D-band of carbon as measured by Raman spectroscopy.

8 Claims, 7 Drawing Sheets

(51) Int. Cl.
| | | |
|---|---|---|
| C04B 41/50 | (2006.01) | |
| C30B 29/36 | (2006.01) | |
| C04B 41/52 | (2006.01) | |
| C30B 35/00 | (2006.01) | |
| H01L 21/687 | (2006.01) | |
| C23C 16/458 | (2006.01) | |
| H01L 21/683 | (2006.01) | |
| C04B 41/00 | (2006.01) | |
| C04B 41/45 | (2006.01) | |
| C04B 41/53 | (2006.01) | |

(52) U.S. Cl.
CPC ...... *C04B 41/5059* (2013.01); *C04B 41/5061* (2013.01); *C04B 41/52* (2013.01); *C23C 16/4581* (2013.01); *C30B 29/36* (2013.01); *C30B 35/00* (2013.01); *H01L 21/68757* (2013.01); *C04B 41/00* (2013.01); *C04B 41/4529* (2013.01); *C04B 41/53* (2013.01); *H01L 21/683* (2013.01); *Y10T 428/24612* (2015.01); *Y10T 428/265* (2015.01); *Y10T 428/30* (2015.01)

(58) Field of Classification Search
CPC ..... C04B 41/52; C04B 41/00; C04B 41/4529; C04B 41/53; C23C 16/4581; C30B 29/36; C30B 35/00; H01L 21/68757; H01L 21/683; Y10T 428/24612; Y10T 428/30; Y10T 428/265
See application file for complete search history.

(56) References Cited

U.S. PATENT DOCUMENTS

| 2012/0040172 A1 | 2/2012 | Fujiwara et al. |
| 2013/0327274 A1 | 12/2013 | Ohno et al. |

FOREIGN PATENT DOCUMENTS

| JP | 2004-84057 A | 3/2004 |
|---|---|---|
| JP | 2006-41358 A | 2/2006 |
| JP | 2006-60195 A | 3/2006 |
| JP | 2010-30846 A | 2/2010 |
| JP | 2011-153045 A | 8/2011 |
| JP | 2013-254853 A | 12/2013 |
| WO | 2006/085635 A1 | 8/2006 |
| WO | 2009/081006 A2 | 7/2009 |

OTHER PUBLICATIONS

International Search Report dated Mar. 4, 2014 issued in corresponding application No. PCT/JP2014/051821.
Extended (Supplementary) Search Report dated Sep. 26, 2016, issued in counterpart European Application No. 14748688.0 (7 pages).
Office Action dated May 4, 2016, issued in counterpart Chinese Patent Application No. 201480007718.1. (8 pages).

[FIG. 1.]
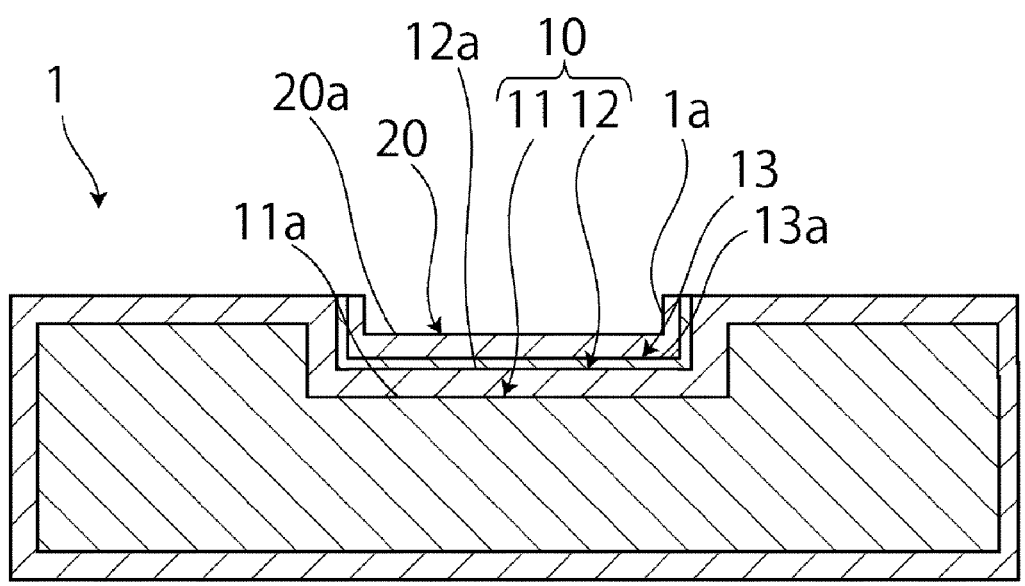

[FIG. 2.]
Example 1
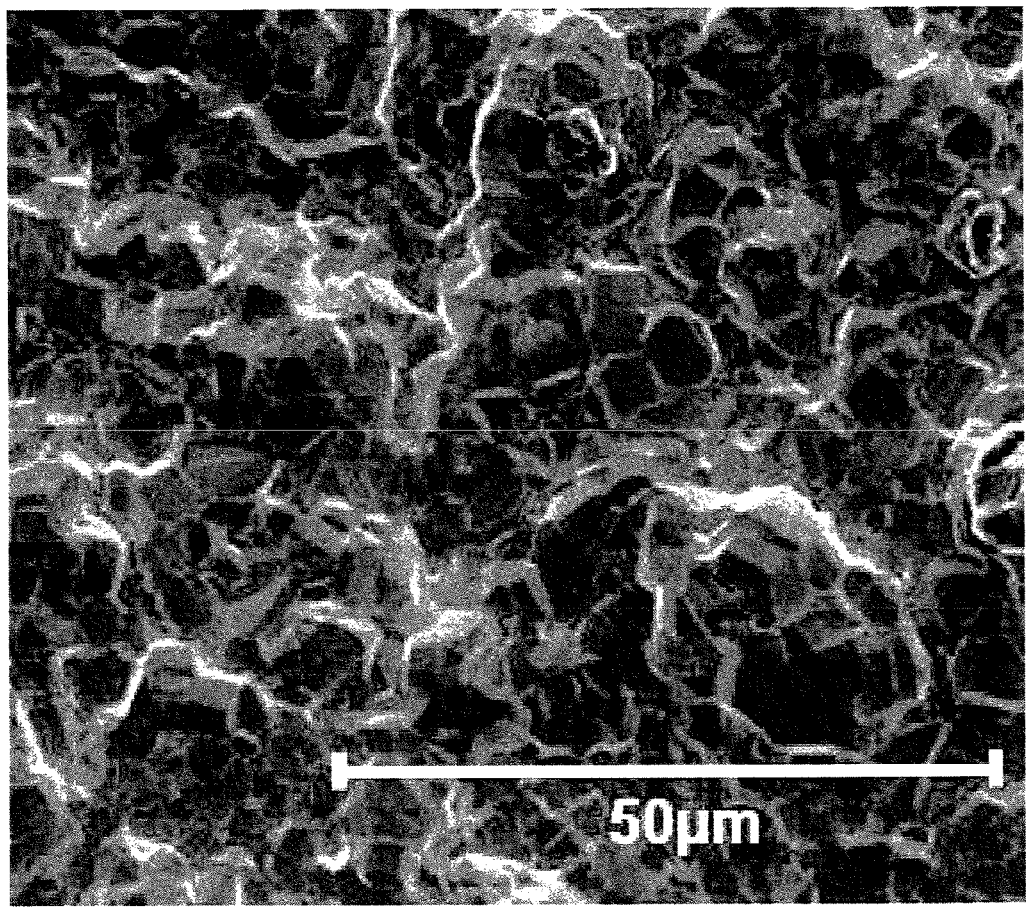

[FIG. 3.]
Example 2
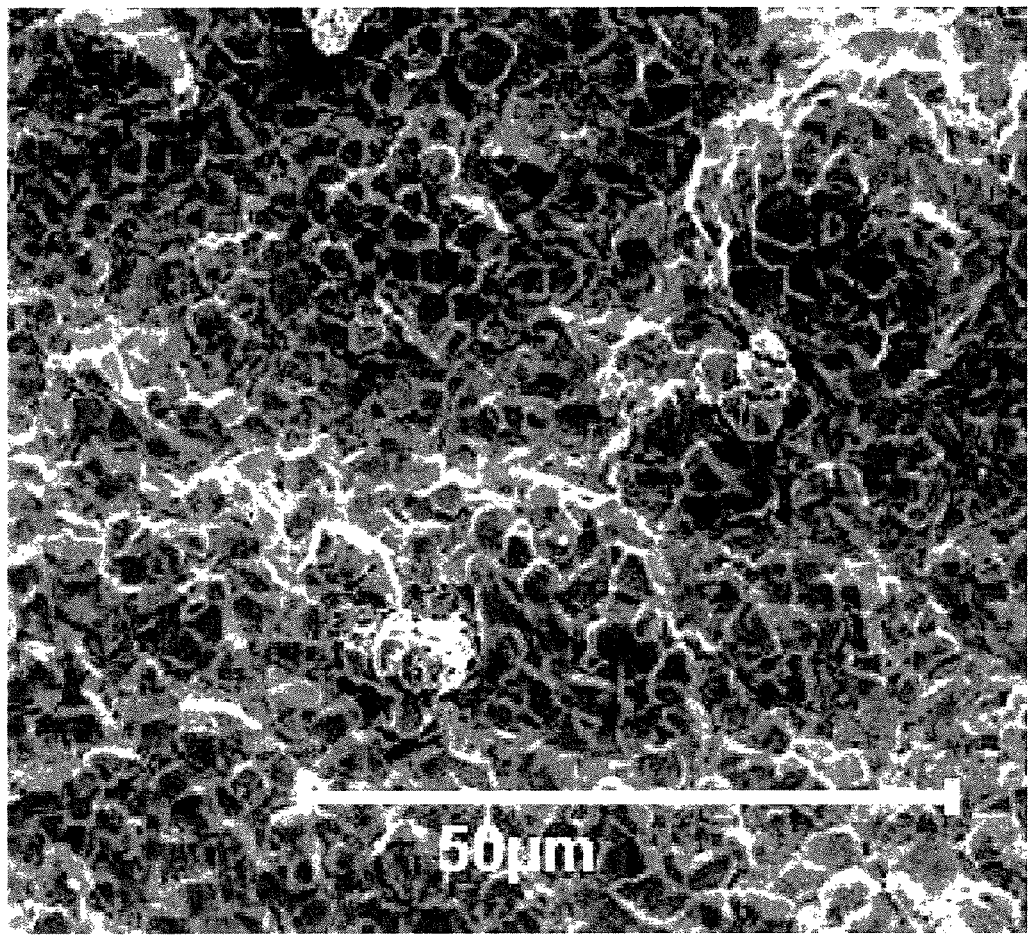

[FIG. 4.]
Example 3
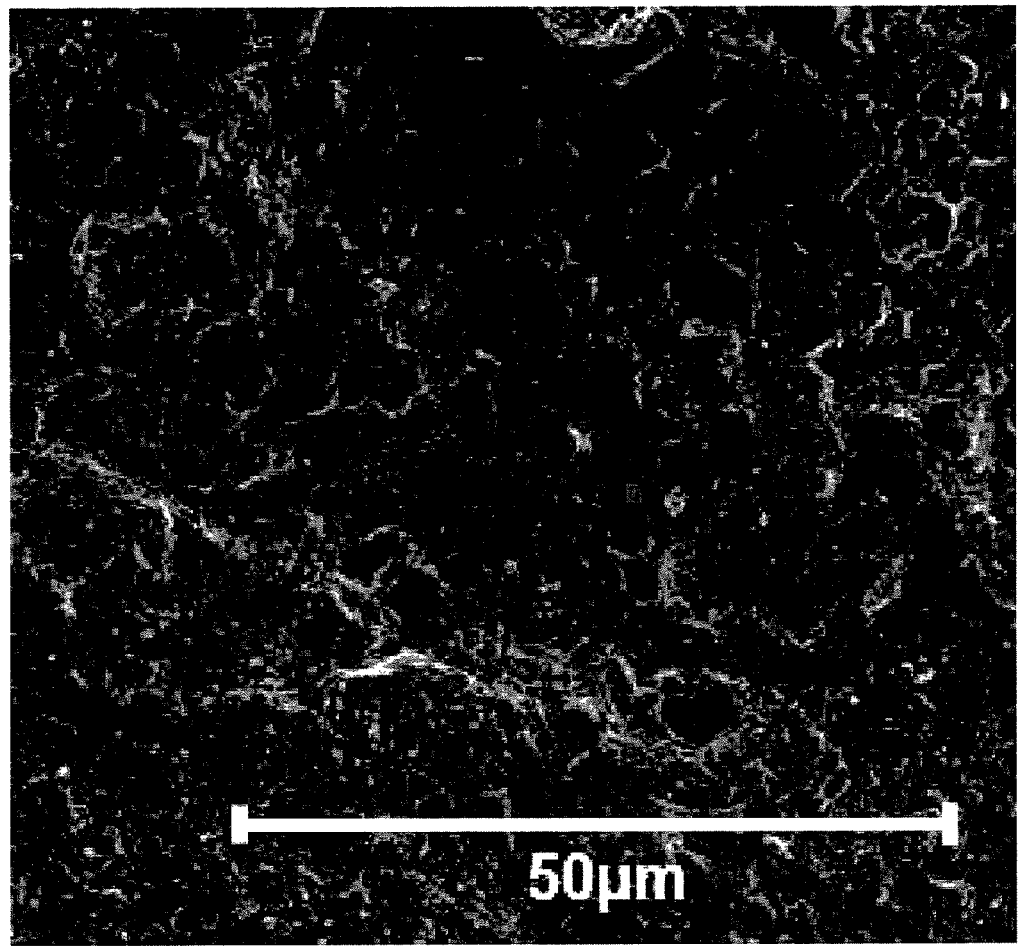

[FIG. 5.]
Example 4
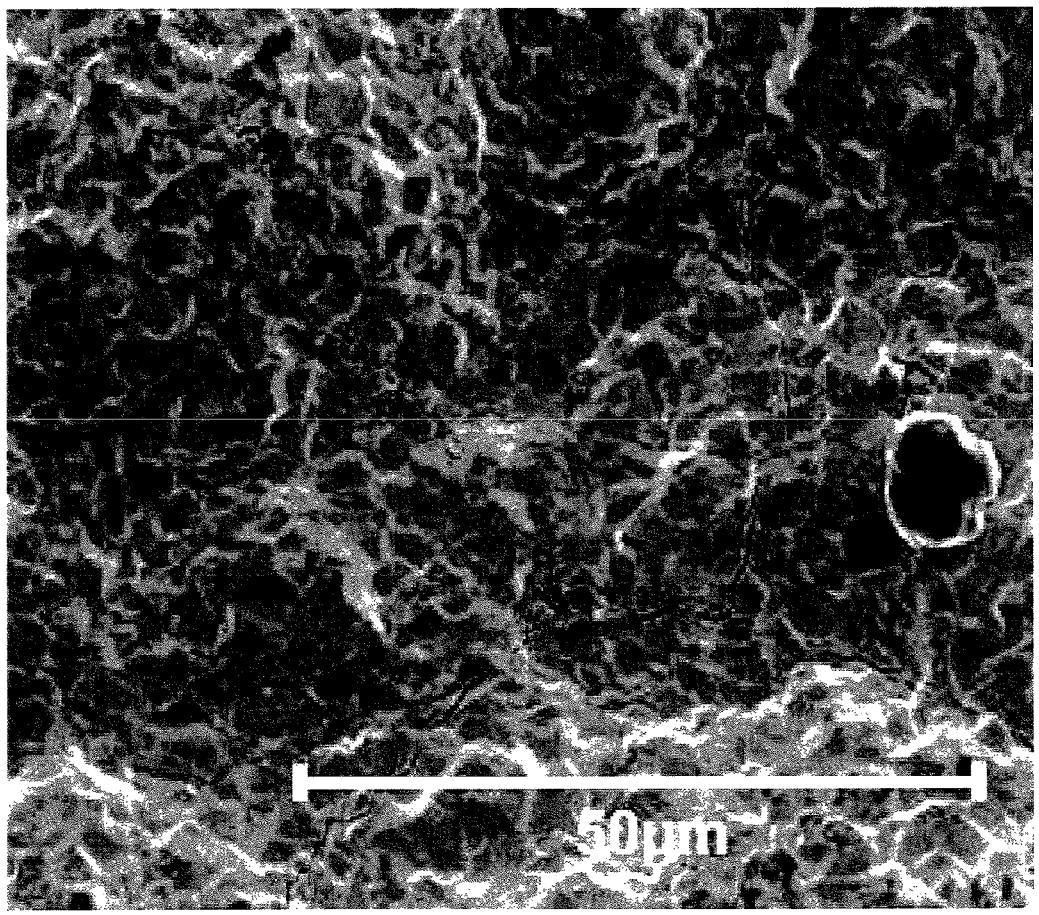

[FIG. 6.]
Reference Example 1
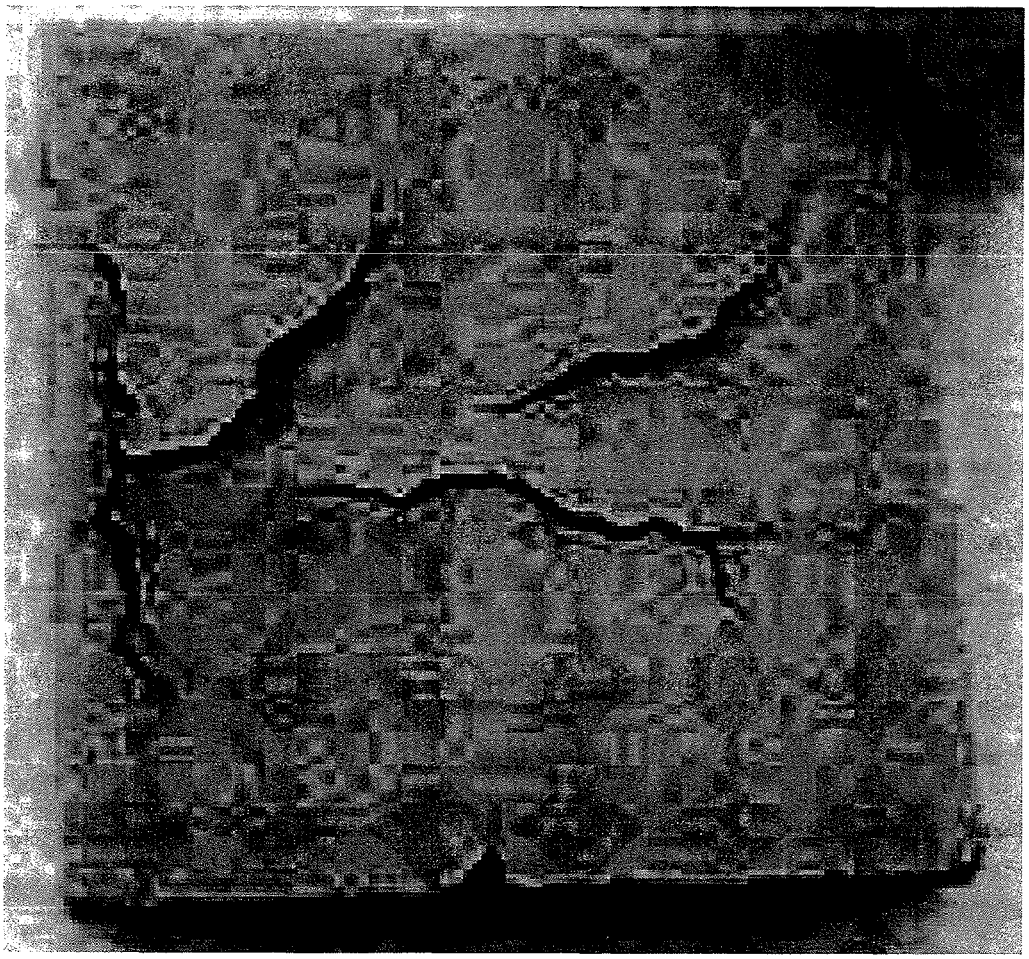

[FIG. 7.]
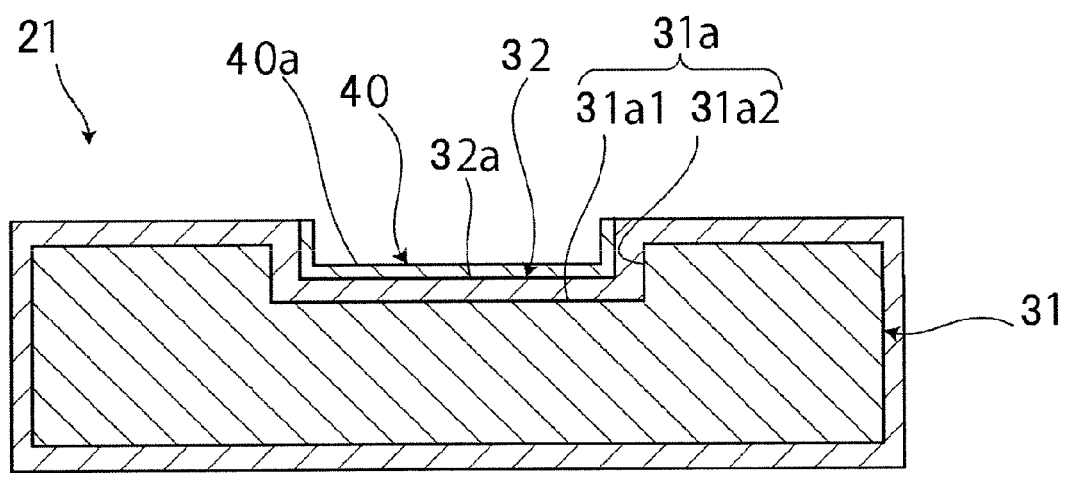

SILICON CARBIDE-TANTALUM CARBIDE COMPOSITE AND SUSCEPTOR

TECHNICAL FIELD

The present invention relates to silicon carbide-tantalum carbide composites and susceptors.

BACKGROUND ART

Conventionally, it is known to use, as a susceptor or the like for use in a semiconductor manufacturing process or the like, a member whose surface layer is made of silicon carbide. However, in cases such as where silicon carbide or the like is epitaxially grown on a substrate placed on the surface layer made of silicon carbide, the substrate and the susceptor are exposed to high temperatures, for example, over 1500° C. Therefore, there arises a problem of deposition of silicon carbide forming the surface layer of the susceptor on the substrate.

To solve the above problem, for example, a susceptor whose surface layer is made of tantalum carbide is proposed. For example, Patent Literature 1 discloses a susceptor in which at least part of a portion for placing a wafer thereon is formed of a graphite material coated with tantalum carbide.

CITATION LIST

Patent Literature

Patent Literature 1: JP-A-2006-60195

SUMMARY OF INVENTION

Technical Problem

However, tantalum is very expensive and, therefore, the susceptor disclosed in Patent Literature 1 has a problem of high cost.

As a method for solving the above problem, for example, it is conceivable to reduce the cost of a susceptor coated with a tantalum carbide layer by providing a silicon carbide layer on the surface of a graphite base material and then providing a thin tantalum carbide layer on the silicon carbide layer.

However, the silicon carbide and tantalum carbide have significantly different coefficients of thermal expansion. Therefore, such a susceptor has a problem with durability, such as delamination between the silicon carbide layer and the tantalum carbide layer due to temperature changes.

Under these circumstances, there is a demand for a member having a surface layer made of tantalum carbide and having excellent durability.

Furthermore, such a susceptor as disclosed in Patent Literature 1 has another problem of low thermal uniformity of the surface where a wafer is to be placed. If the thermal uniformity of the surface where a wafer is to be placed is low, the occurrence of variations in wafer temperature may prevent semiconductor growth from uniformly progressing on the wafer.

A primary object of the present invention is to provide a silicon carbide-tantalum carbide composite having excellent durability.

A secondary object of the present invention is to provide a susceptor having excellent thermal uniformity.

Solution to Problem

A silicon carbide-tantalum carbide composite according to a first aspect of the present invention includes: a body whose surface layer is at least partly formed of a first silicon carbide layer; a tantalum carbide layer; and a second silicon carbide layer. The tantalum carbide layer is disposed over the first silicon carbide layer. The second silicon carbide layer is interposed between the tantalum carbide layer and the first silicon carbide layer. The second silicon carbide layer has a C/Si composition ratio of not less than 1.2 as measured by X-ray photoelectron spectroscopy.

In the silicon carbide-tantalum carbide composite according to the first aspect of the present invention, the second silicon carbide layer preferably has a C/Si composition ratio of not more than 6.0 as measured by X-ray photoelectron spectroscopy.

A silicon carbide-tantalum carbide composite according to a second aspect of the present invention includes: a body whose surface layer is at least partly formed of a first silicon carbide layer; a tantalum carbide layer; and a second silicon carbide layer. The tantalum carbide layer is disposed over the first silicon carbide layer. The second silicon carbide layer is interposed between the tantalum carbide layer and the first silicon carbide layer. The second silicon carbide layer has a peak intensity ratio G/D of not less than 1.0 between the G-band and D-band of carbon as measured by Raman spectroscopy.

In the silicon carbide-tantalum carbide composite according to the second aspect of the present invention, the second silicon carbide layer preferably has a peak intensity ratio G/D of not more than 7.5 between the G-band and D-band of carbon as measured by Raman spectroscopy.

In the silicon carbide-tantalum carbide composites according to the first and second aspects of the present invention, the second silicon carbide layer preferably has a crystallite diameter of not more than 753 Angstroms.

In the silicon carbide-tantalum carbide composites according to the first and second aspects of the present invention, the body preferably includes a graphite base material and the first silicon carbide layer disposed on the graphite base material.

In the silicon carbide-tantalum carbide composites according to the first and second aspects of the present invention, the second silicon carbide layer preferably has a thickness of not less than 0.05 μm.

Susceptors according to the first and second aspects of the present invention include the silicon carbide-carbon composite and include a recess of which at least one of bottom and side surfaces is formed of the tantalum carbide layer.

A susceptor according to a third aspect of the present invention includes a base material, a tantalum carbide layer, and a silicon carbide layer. The base material includes a recess. The tantalum carbide layer is disposed over a bottom surface of the recess. The silicon carbide layer is interposed between the tantalum carbide layer and the base material.

In the susceptor according to the third aspect of the present invention, the silicon carbide layer on the bottom surface of the recess is preferably thicker than the tantalum carbide layer.

In the susceptor according to the third aspect of the present invention, the silicon carbide layer on the bottom surface of the recess preferably has a thickness of not less than 60 μm.

In the susceptor according to the third aspect of the present invention, the tantalum carbide layer over the bottom surface of the recess preferably has a thickness of not more than 10 μm.

In the susceptor according to the third aspect of the present invention, preferably, the tantalum carbide layer is also disposed over a side surface of the recess and the silicon carbide layer is disposed on the side surface of the recess between the tantalum carbide layer and the base material.

In the susceptor according to the third aspect of the present invention, the base material is preferably made of graphite.

Advantageous Effects of Invention

Each of the first and second aspects of the present invention can provide a silicon carbide-tantalum carbide composite having excellent durability.

The third aspect of the present invention can provide a susceptor having excellent thermal uniformity.

BRIEF DESCRIPTION OF DRAWINGS

FIG. 1 is a schematic cross-sectional view of a silicon carbide-tantalum carbide composite according to one embodiments of first and second aspects of the present invention.

FIG. 2 is a photograph of a surface of a tantalum carbide layer in a silicon carbide-tantalum carbide composite obtained in Example 1.

FIG. 3 is a photograph of a surface of a tantalum carbide layer in a silicon carbide-tantalum carbide composite obtained in Example 2.

FIG. 4 is a photograph of a surface of a tantalum carbide layer in a silicon carbide-tantalum carbide composite obtained in Example 3.

FIG. 5 is a photograph of a surface of a tantalum carbide layer in a silicon carbide-tantalum carbide composite obtained in Example 4.

FIG. 6 is a photograph of a surface of a tantalum carbide layer in a silicon carbide-tantalum carbide composite obtained in Reference Example 1.

FIG. 7 is a schematic cross-sectional view of a susceptor according to one embodiment of a third aspect of the present invention.

DESCRIPTION OF EMBODIMENTS

A description will be given below of an example of a preferred embodiment for working of the present invention. However, the following embodiment is merely illustrative. The present invention is not at all limited by the following embodiment.

The drawings to which the embodiment and the like refer are schematically illustrated, and the dimensional ratios and the like of objects illustrated in the drawings may be different from those of the actual objects. The dimensional ratios and the like of specific objects should be determined in consideration of the following descriptions.

(Silicon Carbide-Tantalum Carbide Composite 1)

FIG. 1 is a schematic cross-sectional view of a silicon carbide-tantalum carbide composite according to this embodiment. With reference to FIG. 1, a description will be given of the structure of the silicon carbide-tantalum carbide composite 1 according to this embodiment.

The silicon carbide-tantalum carbide composite 1 can be used, for example, as a susceptor or the like for use in a semiconductor manufacturing process or the like. In the case where the silicon carbide-tantalum carbide composite 1 is used as a susceptor, semiconductor devices can be manufactured by placing a wafer or the like in a recess 1a in the silicon carbide-tantalum carbide composite 1. In the present invention, however, the silicon carbide-tantalum carbide composite is not limited to the use as a susceptor but can be used in various applications. Furthermore, the shape of the silicon carbide-tantalum carbide composite can be appropriately designed. For example, the silicon carbide-tantalum carbide composite may not have the recess.

The silicon carbide-tantalum carbide composite 1 includes a body 10, a second silicon carbide layer 13, and a tantalum carbide layer 20.

The body 10 includes: a graphite base material 11 including a recess; and a first silicon carbide layer 12.

The graphite base material 11 is substantially made of graphite. The graphite base material 11 may contain components other than graphite, such as boron.

The first silicon carbide layer 12 is disposed on the graphite base material 11. Specifically, the first silicon carbide layer 12 is disposed on the entire surface 11a of the graphite base material 11. In other words, the entire surface layer of the body 10 is formed of the first silicon carbide layer 12. However, in the present invention, it is sufficient that the first silicon carbide layer is disposed on at least a portion of the graphite base material. In other words, it is sufficient that the surface layer of the body is at least partly formed of the first silicon carbide layer. The first silicon carbide layer is preferably disposed on the recess in the graphite base material. In other words, the surface layer of the recess in the body is preferably formed of the first silicon carbide layer.

No particular limitation is placed on the thickness of the first silicon carbide layer 12. To increase the durability of the silicon carbide-tantalum carbide composite 1, the thickness of the first silicon carbide layer 12 is preferably not less than 60 μm and more preferably not less than 80 μm. The thickness of the first silicon carbide layer 12 is preferably not more than 200 μm.

The first silicon carbide layer 12 is substantially made of silicon carbide.

The first silicon carbide layer 12 normally has a C/Si composition ratio smaller than 1.2 as measured by X-ray photoelectron spectroscopy.

Silicon carbide making the first silicon carbide layer 12 normally has a crystallite diameter greater than 700 Angstroms.

The first silicon carbide layer 12 normally has a peak intensity ratio G/D smaller than 1.0 between the G-band and D-band of carbon as measured by Raman spectroscopy. In the present invention, the peak intensity ratio G/D between the G-band and D-band of carbon measured by Raman spectroscopy is a value obtained by measurement with a microscopic Raman spectrometer (Almega dispersive laser Raman spectrometer) manufactured by Thermo Fisher Scientific Inc., using Ar laser with a wavelength of 532 nm.

Silicon carbide making the first silicon carbide layer 12 normally has a crystallite diameter of not less than 700 Angstroms and preferably not less than 753 Angstroms.

A tantalum carbide layer 20 is disposed over the first silicon carbide layer 12. Specifically, within the recess formed in the body 10, the tantalum carbide layer 20 is disposed over the first silicon carbide layer 12.

The tantalum carbide layer 20 is substantially made of tantalum carbide.

To increase the durability of the silicon carbide-tantalum carbide composite 1, the thickness of the tantalum carbide layer 20 is preferably not less than 0.1 μm and more preferably not less than 1 μm. The thickness of the tantalum carbide layer 20 is preferably not more than 10 μm.

A second silicon carbide layer 13 is interposed between the tantalum carbide layer 20 and the first silicon carbide layer 12. Specifically, within the recess 1a in the silicon carbide-tantalum carbide composite 1, the second silicon carbide layer 13 is interposed between the tantalum carbide layer 20 and the first silicon carbide layer 12. More specifically, the second silicon carbide layer 13 is disposed directly on the surface 12a of the first silicon carbide layer 12 and the tantalum carbide layer 20 is disposed directly on the surface 13a of the second silicon carbide layer 13. The second silicon carbide layer 13 functions as an adhesion layer allowing the tantalum carbide layer 20 and the first silicon carbide layer 12 to adhere to each other.

The second silicon carbide layer 13 is substantially made of silicon carbide.

The second silicon carbide layer 13 has a C/Si composition ratio of not less than 1.2 as measured by X-ray photoelectron spectroscopy. Thus, the silicon carbide-tantalum carbide composite 1 has excellent durability. The details of the reason for this are not necessarily clear but, for example, can be assumed as follows. As described previously, since silicon carbide and tantalum carbide have significantly different coefficients of thermal expansion, the silicon carbide layer and the tantalum carbide layer are generally likely to be delaminated from each other when undergoing temperature changes. In this relation, tantalum and carbon contained in tantalum carbide form strong bond. The second silicon carbide layer 13 has a C/Si composition ratio of not less than 1.2 as measured by X-ray photoelectron spectroscopy, which shows that the carbon content in the second silicon carbide layer 13 is high. It can be assumed that, therefore, the silicon carbide layer and the tantalum carbide layer become strongly bonded to each other, resulting in increased adhesion between the second silicon carbide layer 13 and the tantalum carbide 20. Particularly, by initially forming a tantalum layer and then subjecting it to carburization to convert it into a tantalum carbide layer 20, tantalum in the tantalum layer and carbon in the second silicon carbide layer 13 become more likely to be strongly bonded to each other, resulting in higher adhesion.

To increase the durability of the silicon carbide-tantalum carbide composite 1, the second silicon carbide layer 13 preferably has a C/Si composition ratio of not more than 6.0 and more preferably not more than 5.0, as measured by X-ray photoelectron spectroscopy. The reason for this is that if the proportion of carbon contained in the second silicon carbide layer 13 is too high, the adhesion between the second silicon carbide layer 13 and the first silicon carbide layer 12 may decrease. Furthermore, if the proportion of carbon contained in the second silicon carbide layer 13 is too high, the strength of the second silicon carbide layer 13 may decrease.

The second silicon carbide layer 13 has a peak intensity ratio G/D of not less than 1.0 and preferably not less than 1.1 between the G-band and D-band of carbon as measured by Raman spectroscopy. Thus, the silicon carbide-tantalum carbide composite 1 has excellent durability. The details of the reason for this are not necessarily clear but, for example, can be assumed as follows. As described previously, since silicon carbide and tantalum carbide have significantly different coefficients of thermal expansion, the silicon carbide layer and the tantalum carbide layer are generally likely to be delaminated from each other when undergoing temperature changes. In this relation, tantalum and carbon contained in tantalum carbide form strong bond. The second silicon carbide layer 13 has a peak intensity ratio G/D of not less than 1.0 between the G-band and D-band of carbon as measured by Raman spectroscopy, which shows that the rate of carbon-carbon bonds is high. In other words, the carbon content in the second silicon carbide layer 13 is high. It can be assumed that, therefore, the silicon carbide layer and the tantalum carbide layer become strongly bonded to each other, resulting in increased adhesion between the second silicon carbide layer 13 and the tantalum carbide 20. Particularly, it can be assumed that by initially forming a tantalum layer and then subjecting it to carburization to convert it into a tantalum carbide layer 20, tantalum in the tantalum layer and carbon in the second silicon carbide layer 13 become more likely to be strongly bonded to each other, resulting in higher adhesion.

To increase the durability of the silicon carbide-tantalum carbide composite 1, the second silicon carbide layer 13 preferably has a peak intensity ratio G/D of not more than 7.5 and more preferably not more than 5.0 between the G-band and D-band of carbon as measured by Raman spectroscopy. The reason for this is that if the proportion of carbon contained in the second silicon carbide layer 13 is too high, the adhesion between the second silicon carbide layer 13 and the first silicon carbide layer 12 may decrease. Furthermore, if the proportion of carbon contained in the second silicon carbide layer 13 is too high, the strength of the second silicon carbide layer 13 may decrease.

No particular limitation is placed on the thickness of the second silicon carbide layer 13. To increase the durability of the silicon carbide-tantalum carbide composite 1, the thickness of the second silicon carbide layer 13 is preferably not less than 0.05 µm and more preferably not less than 0.5 µm. The thickness of the second silicon carbide layer 13 is preferably not more than 1 µm.

To increase the durability of the silicon carbide-tantalum carbide composite 1, the crystallite diameter of silicon carbide making the second silicon carbide layer 13 is preferably not more than 753 Angstroms and more preferably not more than 740 Angstroms. The reason for this can be that when the silicon content in the second silicon carbide layer 13 is decreased, the crystallite diameter is also decreased to increase the anchoring effect between the second silicon carbide layer 13 and the tantalum carbide layer 20. The crystallite diameter of silicon carbide making the second silicon carbide layer 13 is preferably not less than 600 Angstroms.

The silicon carbide-tantalum carbide composite 1 can be suitably used, for example, as a susceptor or the like for use in a semiconductor manufacturing process or the like. In the case where the silicon carbide-tantalum carbide composite 1 is used as a susceptor, semiconductor devices can be manufactured by placing a wafer or the like on the surface 20a of the tantalum carbide layer 20 formed on the recess 1a in the silicon carbide-tantalum carbide composite 1.

(Method for Producing Silicon Carbide-Tantalum Carbide Composite 1)

The silicon carbide-tantalum carbide composite 1 can be produced, for example, in the following manner. First, a graphite base material 11 is prepared. Next, a first silicon carbide layer 12 is formed on the surface 11a of the graphite base material 11 by thermal CVD or other processes. Next, at least a portion of the surface of the first silicon carbide layer 12 is subjected to etching using $H_2$ gas, $Cl_2$ gas or the like or to thermal carbonization to form a second silicon carbide layer 13 having a C/Si composition ratio of not less than 1.2 as measured by X-ray photoelectron spectroscopy or a second silicon carbide layer 13 having a peak intensity ratio G/D of not less than 1.0 between the G-band and D-band of carbon as measured by Raman spectroscopy. Next, a tantalum layer is formed on the surface 13a of the second silicon carbide layer 13 by chemical vapor deposition (CVD) or other processes. Thereafter, the tantalum layer is subjected to carburization to form a tantalum carbide layer 20. A silicon carbide-tantalum carbide composite 1 can be produced in the above manner. The carburization can be performed by a known method, such as a method described in Published Japanese Patent Application No. 2010-280948.

Hereinafter, the present invention will be described in more detail with reference to specific examples. The present invention is not at all limited by the following examples. Modifications and variations may be appropriately made therein without changing the gist of the present invention.

Example 1

A silicon carbide-tantalum carbide composite having substantially the same structure as the silicon carbide-tantalum carbide composite 1 was produced in the above manner.

A piece of high-purity graphite with a recess (IG-610U manufactured by Toyo Tanso Co., Ltd.) was used as a graphite base material 11. This graphite base material 11 was placed in a CVD apparatus and subjected to a CVD process at a furnace pressure of 250 Torr and a base material temperature of 1400° C. using $SiCl_4+C_3H_8$ as a source gas to form a first silicon carbide layer 12 of 100 μm thickness over the entire surface of the piece of high-purity graphite, resulting in a silicon carbide-graphite composite with a recess. The first silicon carbide layer 12 was substantially made of β-silicon carbide.

Next, the entire surface of the silicon carbide-graphite composite other than the recess was coated with high-purity isotropic graphite (Grade "IG-610U" manufactured by Toyo Tanso Co., Ltd.). Next, the silicon carbide layer formed within the recess was subjected to $H_2$ etching, thus producing a body 10 in which a second silicon carbide layer 13 was formed on the first silicon carbide layer 12. In the $H_2$ etching, first, $H_2$ gas was allowed to flow to the silicon carbide layer at approximately 1300° C. for an hour under a reduced pressure of approximately 10 Torr to etch Si in the surface layer of the first silicon carbide layer 12 located within the recess. The C/Si composition ratio of the second silicon carbide layer 13 measured by X-ray photoelectron spectroscopy after the $H_2$ etching was 1.3. In the measurement of the C/Si composition ratio, an X-ray photoelectron spectrometer (ESCA, a scanning X-ray photoelectron spectroscopy instrument PHI Quantera SXM (Registered Trademark) manufactured by ULVAC-PHI, Inc.) was used. The peak intensity ratio G/D of the second silicon carbide layer 13 between the G-band and D-band of carbon measured by Raman spectroscopy after the $H_2$ etching was 1.15. The peak intensity ratio G/D by Raman spectroscopy was measured with a microscopic Raman spectrometer (Almega dispersive laser Raman spectrometer) manufactured by Thermo Fisher Scientific Inc., using Ar laser with a wavelength of 532 nm. Furthermore, the thickness of the second silicon carbide layer 13 was 0.05 μm as measured with a SEM (JSM-6510LA manufactured by JEOL Ltd.). The crystallite diameter of the second silicon carbide layer 13 was 641.0 Angstroms as measured with an XRD (RINT-Ultima III manufactured by Rigaku Corporation).

Next, the entire surface of the body 10 other than the recess was coated with the aforementioned high-purity isotropic graphite. Furthermore, a 4-μm thick tantalum layer 20 was formed on the recess in the body 10 by a chemical vapor deposition (CVD) process. The conditions for the CVD process was as follows:

Source gas: $TaCl_5$ and $H_2$
Carrier gas: argon
Temperature: 1000° C.
Pressure: 200 Pa Next, the obtained tantalum layer was subjected to carburization, resulting in a silicon carbide-tantalum carbide composite having a 5-μm thick tantalum carbide layer 20 formed thereon. The carburization was performed in the following manner.

The body 10 having the tantalum layer formed thereon was placed in a chamber. The material of the chamber was an isotropic graphite material with a bulk density of 1.8. The chamber in which the body 10 with the tantalum layer formed thereon was placed was put in a vacuum vessel made of SUS. The vacuum vessel was internally provided with a heat insulating material. The chamber was put in a space formed in the heat insulating material. Used as the heat insulating material was a material having a trade name "DON-1000" (manufactured by Osaka Gas Chemicals Co., Ltd. and having a bulk density of 0.16 g/cm³). This heat insulating material is a porous heat insulating material obtained by impregnating pitch-based carbon fibers with resin and subjecting them to forming, curing, carbonization, and graphitization.

A carbon heater is disposed above the space surrounded by the heat insulating material. The carbon heater is supported by graphite electrodes for use in applying electric current to the carbon heater. By applying electric current to the carbon heater, the interior of the space surrounded by the heat insulating material can be heated. The vacuum vessel has an exhaust port formed therein for use in exhausting gas in the vacuum vessel. The exhaust port is connected to a vacuum pump. The vacuum vessel was evacuated to reduce the pressure in the chamber to 0.1 Pa or below and, then, the interior of the chamber was heated to 2150° C. at a rate of temperature increase of 710° C./hour by the carbon heater. Then, carburization was performed by holding the chamber temperature at 2150° C. for two hours. The interior of the chamber had a pressure of about 0.5 to about 2.0 Pa. After the carburization, the interior of the chamber was cooled to room temperatures by natural cooling. The cooling period of time was approximately 15 hours.

FIG. 2 shows a photograph of the surface of the tantalum carbide layer 20 of the silicon carbide-tantalum carbide composite obtained in Example 1. As is obvious from FIG. 2, neither crack nor delamination was observed on the surface of the tantalum carbide layer 20.

Example 2

A silicon carbide-tantalum carbide composite was produced in the same manner as in Example 1 except that in the etching of the first silicon carbide layer 12, $Cl_2$ etching was performed using $Cl_2$ gas instead of $H_2$ gas. The C/Si composition ratio of the second silicon carbide layer 13 measured by X-ray photoelectron spectroscopy after the etching was 1.36. The peak intensity ratio G/D of the second silicon carbide layer 13 between the G-band and D-band of carbon measured by Raman spectroscopy was 4.03. The crystallite diameter of the second silicon carbide layer 13 was 663.9 Angstroms. The results are shown in Table 1. FIG. 3 shows a photograph of the surface of the tantalum carbide layer 20 of the silicon carbide-tantalum carbide composite obtained in Example 2. As is obvious from FIG. 3, neither crack nor delamination was observed on the surface of the tantalum carbide layer 20.

Example 3

A silicon carbide-tantalum carbide composite was produced in the same manner as in Example 2 except that the period of time for flowing $Cl_2$ gas was two hours. The C/Si composition ratio of the second silicon carbide layer 13 measured by X-ray photoelectron spectroscopy after thermal carbonization was 2.12. The crystallite diameter of the second silicon carbide layer 13 was 739.6 Angstroms. The peak intensity ratio G/D of the second silicon carbide layer 13 between the G-band and D-band of carbon measured by Raman spectroscopy was 5.88. The results are shown in Table 1. FIG. 4 shows a photograph of the surface of the tantalum carbide layer 20 of the silicon carbide-tantalum carbide composite obtained in Example 3. As seen from FIG. 4, slight cracks were observed on the surface of the tantalum carbide layer 20 but were at a practically insignificant level.

Example 4

A silicon carbide-tantalum carbide composite was produced in the same manner as in Example 1 except that the first silicon carbide layer 12 was subjected to thermal carbonization instead of etching. The thermal carbonization was performed in the following manner. The silicon carbide-tantalum carbide composite was put under a reduced pressure of $10^{-4}$ Pa or below and heated at approximately 1800° C. for 0.5 hours to sublimate part of Si from the first silicon carbide layer 12 formed on the recess in the silicon carbide-tantalum carbide composite, resulting in the formation of a second silicon carbide layer 13. The C/Si composition ratio of the second silicon carbide layer 13 measured by X-ray photoelectron spectroscopy after thermal carbonization was 5.39. The peak intensity ratio G/D of the second silicon carbide layer 13 between the G-band and D-band of carbon measured by Raman spectroscopy was 7.20. The crystallite diameter of the second silicon carbide layer 13 was 751.3 Angstroms. The results are shown in Table 1. FIG. 5 shows a photograph of the surface of the tantalum carbide layer 20 of the silicon carbide-tantalum carbide composite obtained in Example 4. As seen from FIG. 5, slight cracks were observed on the surface of the tantalum carbide layer 20 but were at a practically insignificant level.

Reference Example 1

A silicon carbide-tantalum carbide composite was produced in the same manner as in Example 1 except that the first silicon carbide layer 12 was not subjected to etching. The C/Si composition ratio of the first silicon carbide layer measured by X-ray photoelectron spectroscopy was 1.1. The peak intensity ratio G/D of the first silicon carbide layer between the G-band and D-band of carbon measured by Raman spectroscopy was 0. The crystallite diameter of the second silicon carbide layer was 757.7 Angstroms. FIG. 6 shows a photograph of the surface of the tantalum carbide layer of the silicon carbide-tantalum carbide composite obtained in Reference Example 1. As is obvious from FIG. 6, cracks and delamination were observed on the surface of the tantalum carbide layer.

TABLE 1

|  | Ex. 1 | Ex. 2 | Ex. 3 | Ex. 4 | Reference Ex. 1 |
|---|---|---|---|---|---|
| C/Si Composition Ratio | 1.3 | 1.36 | 2.12 | 5.39 | 1.1 |
| G/D ratio | 1.15 | 4.03 | 5.88 | 7.2 | 0 |
| Crystallite Diameter (Å) | 641 | 663.9 | 739.6 | 751.3 | 757.7 |

FIG. 7 is a schematic cross-sectional view showing a susceptor according to an embodiment of a third aspect of the present invention. With reference to FIG. 7, a description will be given of the structure of a susceptor 21 according to this embodiment.

The susceptor 21 is used, for example, in manufacturing semiconductor devices by placing a wafer on a surface 40a of a tantalum carbide layer 40 which is a placement surface for the wafer.

The susceptor 21 includes a base material 31, a tantalum carbide layer 40, and a silicon carbide layer 32.

The base material 31 includes a recess 31a. The base material 31 is preferably substantially made of graphite. When the base material 31 is substantially made of graphite, it may contain components other than graphite, such as boron.

The tantalum carbide layer 40 is disposed over a bottom surface 31a1 of the recess 31a. Furthermore, the tantalum carbide layer 40 is also disposed over a side surface 31a2 of the recess 31a. The tantalum carbide layer 40 is substantially made of tantalum carbide.

The silicon carbide layer 32 is interposed between the tantalum carbide layer 40 and the base material 31. Specifically, the silicon carbide layer 32 is disposed on the bottom surface 31a1 of the recess 31a between the tantalum carbide layer 40 and the base material 31. Also on the side surface 31a2 of the recess 31a, the silicon carbide layer 32 is disposed between the tantalum carbide layer 40 and the base material 31.

In the susceptor 21, the silicon carbide layer 32 is disposed on the entire surface of the base material 31. However, in the present invention, it is sufficient that the silicon carbide layer is disposed on the bottom surface of the recess in the base material and between the tantalum carbide layer and the base material. Insofar as this is the case, the silicon carbide layer may also be disposed on the other portions or may not be disposed on the other portions.

As described previously, a susceptor formed of a graphite material coated with tantalum carbide, such as disclosed in Patent Literature 1, has a problem of low thermal uniformity of the surface where a wafer is to be placed. Unlike this, in the susceptor 21, the silicon carbide layer 32 is interposed between the tantalum carbide layer 40 and the base material 31. Silicon carbide has a high thermal conductivity. Therefore, the silicon carbide layer 32 can transfer heat from the base material 31 to the tantalum carbide layer 40 with high uniformity. Hence, the susceptor 21 has high thermal uniformity across the surface 40a of the tantalum carbide layer 40 serving as a placement surface for a wafer and therefore can transfer heat to the wafer with high uniformity.

To increase the thermal uniformity of the susceptor 21, it is preferred that the silicon carbide layer 32 on the bottom surface 31a1 of the recess 31a be thicker than the tantalum carbide layer 40. Specifically, the thickness of the silicon carbide layer 32 is preferably not less than 60 µm and more preferably not less than 80 µm. Note that because an excessively thick silicon carbide layer 32 increases the surface roughness and degrades the flatness, the thickness of the silicon carbide layer 32 is preferably not more than 200 µm.

When the tantalum carbide layer 40 is disposed also over the side surface 31a2 of the recess 31a and the silicon carbide layer 32 is disposed on the side surface 31a2 of the recess 31a between the tantalum carbide layer 40 and the base material 31, the susceptor 21 can transfer heat to the wafer with higher uniformity.

To increase the thermal uniformity of the susceptor 21, the thickness of the tantalum carbide layer 40 is preferably not more than 10 µm and more preferably not more than 5 µm.

In addition, because tantalum is expensive, the reduction in thickness of the tantalum carbide layer 40 to 10 μm or less leads to reduced cost of the susceptor 21. Note that because an excessively thin tantalum carbide layer 40 is not dense, the thickness of the tantalum carbide layer 40 is preferably not less than 1 μm.

The susceptor 21 can be produced, for example, in the following manner. First, a base material 31 is prepared. Next, a silicon carbide layer 32 is formed on the surface of the base material 31 by thermal CVD or other processes. Then, a tantalum layer is formed on the surface 32a of the silicon carbide layer 32 by chemical vapor deposition (CVD) or other processes. Thereafter, the tantalum layer is subjected to carburization to forma tantalum carbide layer 40. A susceptor 21 can be produced in the above manner. The carburization can be performed by a known method, such as a method described in Published Japanese Patent Application No. 2010-280948.

REFERENCE SIGNS LIST

1 . . . silicon carbide-tantalum carbide composite
10 . . . body
11 . . . graphite base material
11a . . . surface of graphite base material
12 . . . first silicon carbide layer
12a . . . surface of first silicon carbide layer
13 . . . second silicon carbide layer
13a . . . surface of second silicon carbide layer
20 . . . tantalum carbide layer
20a . . . surface of tantalum carbide layer
21 . . . susceptor
31 . . . base material
31a . . . recess in base material
31a1 . . . bottom surface of recess in base material
31a2 . . . side surface of recess in base material
32 . . . silicon carbide layer
32a . . . surface of silicon carbide layer
40 . . . tantalum carbide layer
40a . . . surface of tantalum carbide layer

The invention claimed is:

1. A silicon carbide-tantalum carbide composite comprising: a body whose surface layer is at least partly formed of a first silicon carbide layer;
a tantalum carbide layer disposed over the first silicon carbide layer; and
a second silicon carbide layer interposed between the tantalum carbide layer and the first silicon carbide layer,
wherein the second silicon carbide layer has a C/Si composition ratio of not less than 1.2 as measured by X-ray photoelectron spectroscopy.

2. The silicon carbide-tantalum carbide composite according to claim 1, wherein the second silicon carbide layer has a C/Si composition ratio of not more than 6.0 as measured by X-ray photoelectron spectroscopy.

3. A silicon carbide-tantalum carbide composite comprising: a body whose surface layer is at least partly formed of a first silicon carbide layer;
a tantalum carbide layer disposed over the first silicon carbide layer; and
a second silicon carbide layer interposed between the tantalum carbide layer and the first silicon carbide layer,
wherein the second silicon carbide layer has a peak intensity ratio G/D of not less than 1.0 between the G-band and D-band of carbon as measured by Raman spectroscopy.

4. The silicon carbide-tantalum carbide composite according to claim 3, wherein the second silicon carbide layer has a peak intensity ratio G/D of not more than 7.5 between the G-band and D-band of carbon as measured by Raman spectroscopy.

5. The silicon carbide-tantalum carbide composite according to claim 1, wherein the second silicon carbide layer has a crystallite diameter of not more than 753 Angstroms.

6. The silicon carbide-tantalum carbide composite according to claim 1, wherein the body includes a graphite base material and the first silicon carbide layer disposed on the graphite base material.

7. The silicon carbide-tantalum carbide composite according to claim 1, wherein the second silicon carbide layer has a thickness of not less than 0.05 μm.

8. A susceptor comprising the silicon carbide-tantalum carbide composite according to claim 1, the susceptor including a recess of which at least one of a bottom surface and a side surface is formed of tantalum carbide layer.

* * * * *